(12) United States Patent
Sakurai et al.

(10) Patent No.: US 7,170,787 B2
(45) Date of Patent: Jan. 30, 2007

(54) NONVOLATILE MEMORY APPARATUS

(75) Inventors: Ryotaro Sakurai, Hachioji (JP); Hideo Chigasaki, Kunitachi (JP); Hideo Kasai, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 32 days.

(21) Appl. No.: 11/150,144

(22) Filed: Jun. 13, 2005

(65) Prior Publication Data
US 2005/0276110 A1    Dec. 15, 2005

(30) Foreign Application Priority Data
Jun. 14, 2004    (JP)    ............... 2004-174902

(51) Int. Cl.
*G11C 16/30*    (2006.01)
(52) U.S. Cl. .............. 365/185.18; 365/189.11; 365/227; 365/229
(58) Field of Classification Search ........ 365/227, 365/229
See application file for complete search history.

(56) References Cited

U.S. PATENT DOCUMENTS 5,804,893 A * 9/1998 Fujioka .............. 307/125
5,811,861 A    9/1998 Nunokawa .......... 257/379
5,994,950 A    11/1999 Ochi .................. 327/543
6,385,119 B1 * 5/2002 Kobayashi et al. ...... 365/227
7,023,758 B1 * 4/2006 Hanson et al. ......... 365/229

FOREIGN PATENT DOCUMENTS

| JP | 9-198151 | 7/1997 |
| JP | 10-74394 | 3/1998 |
| JP | 10-150152 | 6/1998 |

* cited by examiner

*Primary Examiner*—Tan T. Nguyen
(74) *Attorney, Agent, or Firm*—Miles & Stockbridge P.C.

(57) ABSTRACT

Current consumption in a nonvolatile memory apparatus operable on two or more different power voltages is to be substantially reduced in its standby mode. A stepped-down power supply unit provided in a flash memory to generate an internal power voltage, when supplied from outside with about 3.3 V as a power voltage, causes a first stepped-down power supply circuit to output the internal power voltage to control circuits when in normal operation. In a low power consumption mode, a second stepped-down power supply circuit outputs the internal power voltage to the control circuits, and in a standby mode a third stepped-down power supply circuit outputs to the control circuits an internal power voltage stepped down by an N-channel MOS transistor.

7 Claims, 7 Drawing Sheets

FIG. 2

| | | MODE | | | | |
|---|---|---|---|---|---|---|
| | | EXTERNAL VCC=3.3V | | | EXTERNAL VCC=1.8V | |
| | | NORMAL OPERATION | LOW-CONSUMPTION OPERATION | STANDBY | NORMAL OPERATION | STANDBY |
| POWER SOURCE | FIRST STEPPED-DOWN POWER SUPPLY CIRCUIT | ○(STEPPED DOWN) | — | — | — | — |
| | SECOND STEPPED-DOWN POWER SUPPLY CIRCUIT | — | ○(STEPPED DOWN) | — | ○(THROUGH) | — |
| | THIRD STEPPED-DOWN POWER SUPPLY CIRCUIT | — | — | ○(Vth) | — | ○(THROUGH) |
| INTERNAL POWER VOLTAGE | | 1.8V | 1.6V | 2.1~1.8V | 1.8V | 1.8V |

| | VCC | 3.3 | 3.0 | 2.4 | 1.8 |
|---|---|---|---|---|---|
| | VDDP | 2.1 | 1.8 | 1.8 | 1.8 |
| | NO. OF MOS STEPS | 2 | 2 | 1 | 0 |
| CONTROL SIGNAL | C1 | H | H | H | L*1 |
| | C2 | H | H | L | H |
| | C3 | L | L | H | H |
| | C4 | L | L | L | H*2 |
| | C5 | L | L | L | H*2 |
| | C6 | L | L | L | H*3 |
| | C7 | L | L | L | H*3 |
| ACTIVATING SIGNAL | APE1 | L | L | L | L |
| | APE2 | L | L | L | L |

ANY OF *1, *2 AND *3 CAN BE USED.

NONVOLATILE MEMORY APPARATUS

CROSS REFERENCE TO RELATED APPLICATION

The present application claims priority from Japanese patent application No. 2004-174902 filed on Jun. 14, 2004, the content of which is hereby incorporated by reference into this application.

BACKGROUND OF THE INVENTION

The present invention relates to a power saving technique for nonvolatile memory apparatuses, and more particularly to a technique that can be effectively applied to power consumption saving in nonvolatile semiconductor memories when in a standby mode.

As memory devices for use in personal computers and multi-functional terminal devices, memory cards such as multimedia cards are in rapidly spreading use. Some of the memory cards are dual voltage cards, operable on two or more different voltages.

As a type of semiconductor memory for use in such a memory card, there is a flash memory operable on two different power voltages (e.g. about 3.3 V and about 1.8 V).

Usually, a flash memory operable on two (or more) power voltages is provided with an internal logical circuit formed on a single semiconductor chip and operable on two different power voltages (e.g. about 3.3 V and about 1.8 V).

According to studies made by the present inventors, it is conceivable, for instance, to dispose within a flash memory a stepped-down power supply circuit, instead of providing an internal logical circuit operable on two (or more) power voltages and, where a power voltage of about 3.3 V is supplied, to step it down to a level of about 1.8 V with that stepped-down power supply circuit, and to supply the stepped-down voltage to the internal logical circuit as an internal power voltage.

Where that power voltage of about 1.8 V is supplied, that power voltage is directly supplied to the internal logical circuit as the internal power voltage.

Techniques described of a nonvolatile memory apparatus configured by using a stepped-down power supply circuit of this kind include one by which, when a load circuit is in a standby mode, data holding in the load circuit is secured by supplying a stepped-down voltage to that load circuit thereby to reduce power consumption (see Patent Reference 1), another by which power consumption in the step-down circuit in the standby mode, in which power consumption by internal circuits decreases, is reduced to save power consumption (see Patent Reference 2) and still another by which one regulator is used in different modes including a low voltage low current consumption mode and a high voltage high current consumption mode (see Patent Reference 3).

Patent Reference 1: Japanese Unexamined Patent Publication No. Hei 09(1997)-198151

Patent Reference 2: Japanese Unexamined Patent Publication No. Hei 10(1998)-74394

Patent Reference 3: Japanese Unexamined Patent Publication No. Hei 10(1998)-150152

SUMMARY OF THE INVENTION

However, the inventors have identified the following problems in the nonvolatile memory apparatuses cited above.

Thus, where an internal logical circuit is made operable on two different power voltages, if the internal logical circuit is designed to match the lower power voltage for instance, the drivability of transistors and the like will become too great when the circuit is operated on the higher power voltage, resulting in a problem of increased current consumption.

Also, where the circuit is to be operable on two different power voltages, its operability should be guaranteed in each of the specified power voltage ranges (e.g. approximate ranges of 2.7 V to 3.6 V and 1.65 V to 1.95 V), and this would make difficult optimal designing of the operational timing among other factors, inviting an increased design cost.

Furthermore, in a nonvolatile memory apparatus in which a stepped-down power supply circuit is provided, if the nonvolatile memory apparatus is used in a memory card, it may be impossible to satisfy the requirement regarding the current consumption in a deep standby mode, in which current consumption is to be significantly reduced, because the stepped-down power supply circuit consumes a large amperage.

An object of the present invention, therefore, is to provide a technique that can be effectively applied to power consumption saving in a nonvolatile semiconductor memory operating on two different power voltages when it is in a standby mode.

The aforementioned and other objects and novel features of the invention will become apparent from the following description in this specification when taken in conjunction with the accompanying drawings.

Typical aspects of the invention disclosed in the present application will be briefly described below.

According to the invention, there is provided a nonvolatile memory apparatus comprising a memory array having a plurality of nonvolatile memory cells, a stepped-up/down power supply circuit for generating from an externally supplied external power voltage a stepped-up voltage and a stepped-down voltage for use in read/write/erase operations on the nonvolatile memory, and a stepped-down power supply unit for generating from an external power voltage a stepped-down power voltage to be supplied to internal logical circuits, wherein the stepped-down power supply unit in an operating mode generates from an external power voltage a stepped-down power voltage and supplies it to the internal logical circuits, and in a standby mode determines the level of the external power voltage, and when the external power voltage is lower than a determination voltage level, supplies the internal logical circuits with the external power voltage as the stepped-down power voltage, and when the external power voltage is higher than the determination voltage level, supplies the internal logical circuits with a stepped-down power voltage resulting from the level-shifting of the external power voltage with a threshold voltage of stepping-down MOS transistors.

Other aspects of the invention under the present application will further be described below.

According to the invention, the nonvolatile memory apparatus has an operating mode power voltage circuit which, on the basis of a control signal from a voltage determining unit, generates a stepped-down power voltage from the external power voltage in the operating mode and supplies it to internal logical circuits, wherein the operating mode power voltage circuit comprises: a mode detecting unit which detects whether the operating mode is a normal operating mode or a low power consumption mode and outputs a control signal on the basis of the result of the detection; a first operating mode power voltage circuit which, on the basis of the control signal outputted from the mode detecting unit, generates a stepped-down power voltage from the external power voltage and supplies it to the internal logical circuits; and a second operating mode power voltage circuit whose current drive capacity is set smaller than that of the first operating mode power voltage circuit, and wherein the mode detecting unit, when it detects the normal operating mode, actuates the first operating mode power voltage circuit to output a control signal so as to stop the second operating mode power voltage circuit and, when it detects the low power consumption mode, actuates the second operating mode power voltage circuit to output a control signal so as to stop the first operating mode power voltage circuit.

Advantages provided by typical aspects of the invention disclosed in the application are briefly described below.

(1) Current consumption by the stepped-down power supply unit in the standby mode can be substantially reduced.

(2) Also, current consumption by the stepped-down power supply unit in the low power consumption mode can be kept less than in the normal operating mode.

(3) Further, by virtue of (1) and (2) above, power saving by nonvolatile memory apparatuses can be realized.

(4) Also, by generating a stepped-down power voltage by using a stepping-down MOS transistor in the standby mode, the circuit dimensions of the stepped-down power supply unit can be reduced to enable nonvolatile memory apparatuses to be made more compact.

BRIEF DESCRIPTION OF THE DRAWINGS

FIG. 2 schematically illustrates the operation of a stepped-down power supply unit provided in the flash memory of FIG. 1.

DETAILED DESCRIPTION OF THE PREFERRED EMBODIMENTS

Preferred embodiments of the present invention will be described in detail below. In all the drawings illustrating the embodiments, the same members will be denoted by respectively the same reference signs in principle, and repetition of their description will be avoided.

(Embodiment 1)

Figure 1:
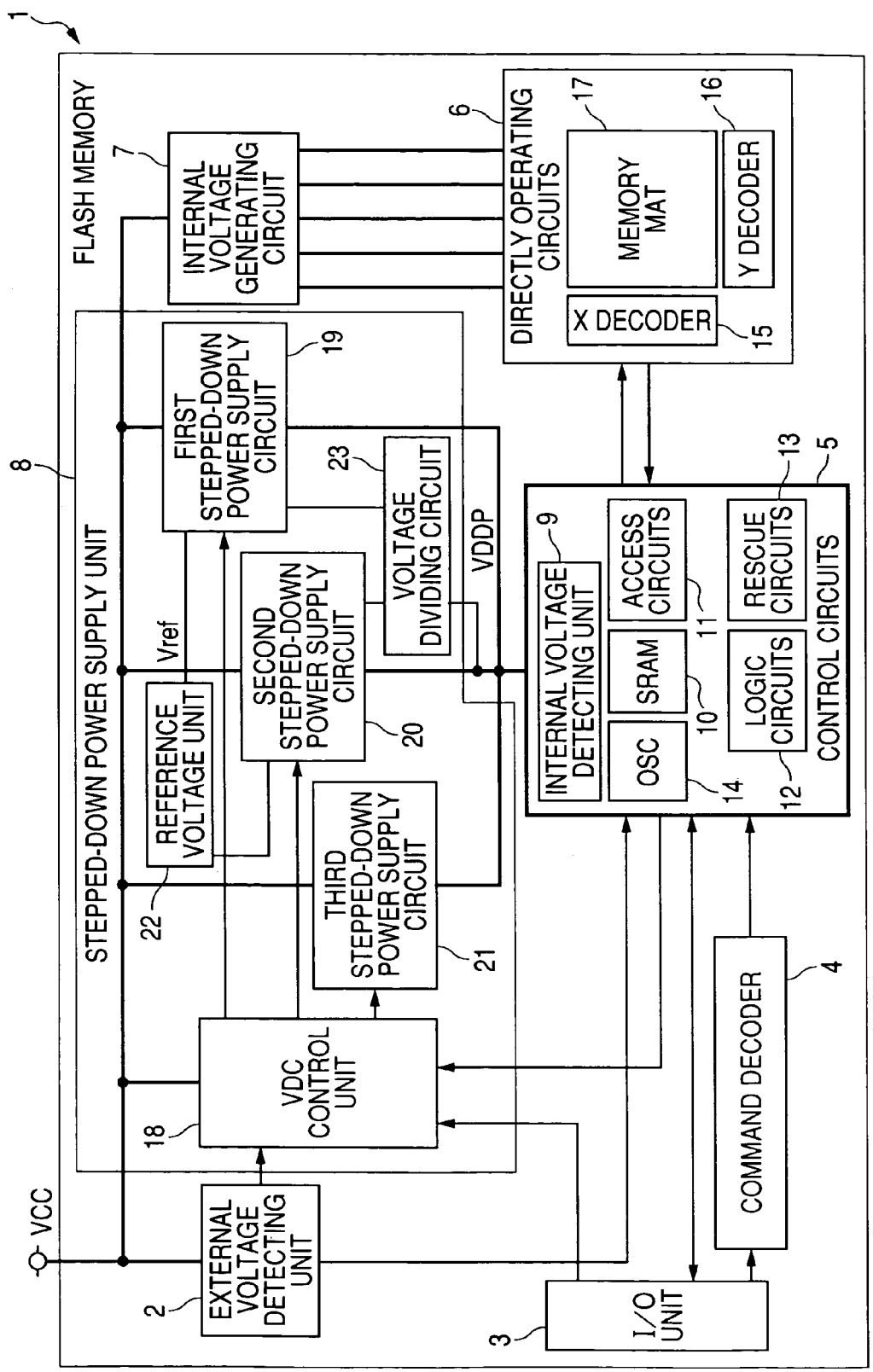
FIG. 1 is a block diagram of a flash memory, which is Embodiment 1 of the present invention.
Figure 3:
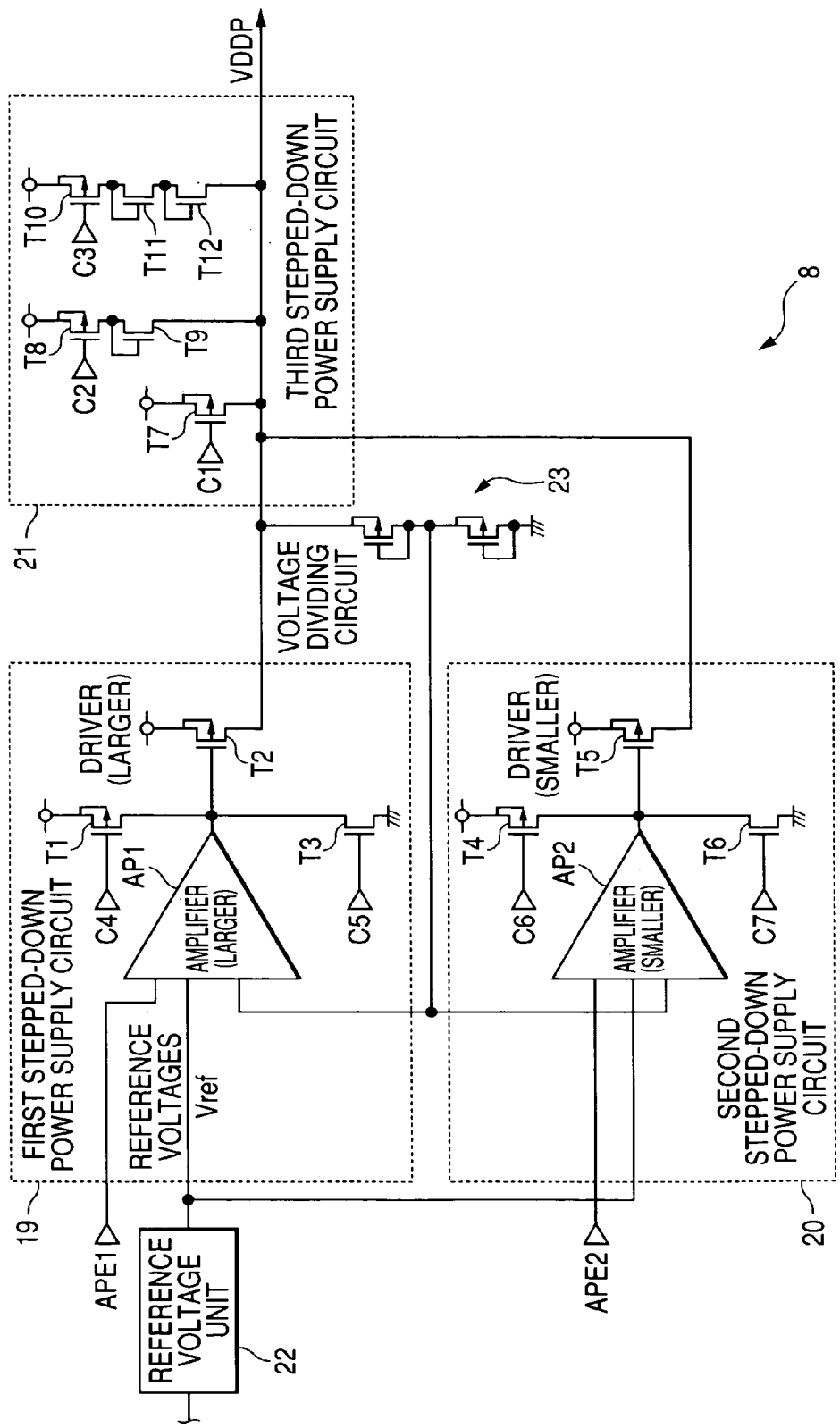
FIG. 3 is a circuit diagram of the stepped-down power supply unit provided in the flash memory of FIG. 1.
Figures 4, 5:
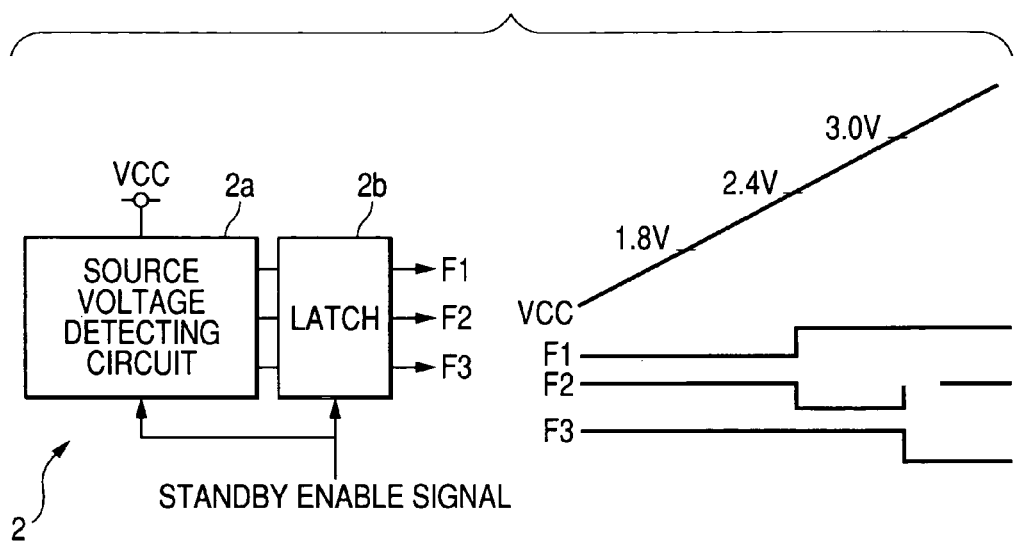
FIG. 4 is a block diagram of and external voltage detecting unit provided in the flash memory of FIG. 1.
FIG. 5 illustrates the operation of the stepped-down power supply unit of FIG. 3 in its standby mode.

FIG. 1 is a block diagram of a flash memory, which is Embodiment 1 of the present invention; FIG. 2 schematically illustrates the operation of a stepped-down power supply unit provided in the flash memory of FIG. 1; FIG. 3 is a circuit diagram of the stepped-down power supply unit provided in the flash memory of FIG. 1; FIG. 4, a block diagram of and external voltage detecting unit provided in the flash memory of FIG. 1; and FIG. 5 illustrates the operation of the stepped-down power supply unit of FIG. 3 in its standby mode.

In this Embodiment 1, a flash memory (nonvolatile memory apparatus) 1 is, for instance, a dual-voltage nonvolatile semiconductor memory operable on two voltages, about 1.8 V and about 3.3 V.

The flash memory 1, as shown in FIG. 1, comprises an external voltage detecting unit 2, I/O unit 3, a command decoder 4, control circuits 5, directly operating circuits 6, an internal voltage generating circuit (stepped-up/down power supply circuit) 7, and a stepped-down power supply unit 8.

The external voltage detecting unit 2 detects the level of a power voltage (external power voltage) VCC supplied from outside, and outputs detection flags F1 through F3 to the internal voltage generating circuit 7 and the control circuits 5 according to the level of the power voltage VCC.

The I/O unit 3 performs timing control of signals inputted to and outputted from the flash memory 1. The command decoder 4 outputs to the control circuits 5 various control signals and decoded command signals inputted via the I/O unit 3.

The control circuits 5 comprises an internal voltage detecting unit (internal logical circuit) 9, an SRAM (internal logical circuit) 10, access circuits (internal logical circuits) 11, logical circuits (internal logical circuits) 12, rescue circuits (internal logical circuits) 13 and an oscillator (OSC) 14. The internal voltage detecting unit 9 detects the level of an internal power voltage (stepped-down power voltage) VDDP outputted from the stepped-down power supply unit 8 and, when VDDP surpasses a certain level, outputs a reset signal.

The static random access memory (SRAM) 10 holds data for write cells of the access circuits 11 including sense amplifiers. The access circuits 11 comprise for instance the sense amplifier for amplifying data outputted from memory cells and outputting the amplified data, a buffer for temporarily storing data outputted from the SRAM 10 and later transferring them, and an interface for data inputting/outputting, and perform read/write of data out of and into the directly operating circuits 6.

The logical circuits 12, outputting various control signals on the basis of decoded signals supplied from the command decoder 4, take charge of all the controls in the flash memory 1. The rescue circuits 13 rescue any faulty memory cell or bit line on the basis of rescue information. The oscillator 14 generates internal operation clock signals and supplies them to internal circuits within the control circuits 5.

The directly operating circuits 6 comprise an X decoder 15, a Y decoder 16 and a memory mat 17. The X decoder 15 decodes address signals in the row direction pre-decoded by the access circuits 11. They decoder 14 decodes address signals in the column (Y) direction. In the memory mat 17, memory cells (nonvolatile memory cells) which are the smallest units of memory are regularly arranged in arrays.

The internal voltage generating circuit 7 generates various power voltages for use in write/read/erase operations in the flash memory 1, and supplies them to the directly operating circuits 6.

The stepped-down power supply unit 8 generates an internal power voltage VDDP, and supplies it to the control circuits 5. The stepped-down power supply unit 8 comprises a VDC control circuit (a voltage determining unit and a mode detecting unit) 18, a first stepped-down power supply circuit (operating mode power voltage circuit) 19, a second stepped-down power supply circuit (operating mode power voltage circuit) 20, a third stepped-down power supply circuit (standby mode stepped-down power supply circuit) 21, a reference voltage unit 22, and a voltage dividing circuit 23.

The VDC control circuit 18 generates and outputs control signals C1 through C7 on the basis of the detection flags F1 through F3 supplied from the external voltage detecting unit 2. The first stepped-down power supply circuit 19, the second stepped-down power supply circuit 20 and the third stepped-down power supply circuit 21 step down the power voltage VCC to generate internal power voltages VDDP.

The reference voltage unit 22 generates a reference voltage Vref, and supplies it to the first stepped-down power supply circuit 19 and the second stepped-down power supply circuit 20. The voltage dividing circuit 23 divides the internal power voltage VDDP, and supplies the divided voltages to the first stepped-down power supply circuit 19 and the second stepped-down power supply circuit 20.

The first stepped-down power supply circuit 19 supplies the control circuits 5 with the internal power voltage VDDP when the flash memory 1 is in its normal operating mode. The second stepped-down power supply circuit 20 supplies the control circuits 5 with the internal power voltage VDDP when the flash memory 1 is in its low power consumption mode. The third stepped-down power supply circuit 21 supplies the control circuits 5 with the internal power voltage VDDP when the flash memory 1 is in its standby mode.

In the low power consumption mode, an internal power voltage VDDP of a lower level than that in normal operation is supplied to the control circuits 5, and the frequency of clock signals generated by the oscillator 14 is lower than in the normal mode. Therefore, the operating speed is lower and the power consumption is less in the low power consumption mode than in the normal mode.

In the standby mode, though an internal power voltage VDDP is supplied by the third stepped-down power supply circuit 21, all other internal circuits than the external voltage detecting unit 2 are at halt in the flash memory 1. Thus, this is a mode of substantial saving in power consumption.

FIG. 2 schematically illustrates the operations of the first stepped-down power supply circuit 19, the second stepped-down power supply circuit 20 and the third stepped-down power supply circuit 21.

When about 3.3 V is supplied from outside as the power voltage VCC as illustrated, when in normal operation the first stepped-down power supply circuit 19 outputs the internal power voltage VDDP (e.g. about 1.8 V) to the control circuits 5.

In the low power consumption mode the second stepped-down power supply circuit 20 outputs an internal power voltage VDDP (e.g. about 1.6 V) to the control circuits 5, while in the standby mode an N-channel MOS transistor of the third stepped-down power supply circuit 21 outputs a stepped-down internal power voltage VDDP (e.g. 1.8 V to 2.1 V approximately) to the control circuits 5.

When a power voltage VCC of about 1.8 V is supplied from outside, in normal operation and in the standby mode, the power voltage VCC is directly outputted to the control circuits 5 as the internal power voltage VDDP. In normal operation when the power voltage VCC of about 1.8 V is supplied from outside, a frequency of about the same level as in the low power consumption mode when a power voltage VCC of about 3.3 V is supplied from outside is generated by the oscillator 14.

The frequency of clock signals in normal operation when a power voltage of about 1.8 V is supplied from outside can be about equal to the frequency at the time when about 3.3 V is supplied from outside. In that case, even when a power voltage of about 1.8 V is supplied from outside, it may be in the low power consumption mode in which the frequency of clock signals is lower than the frequency of clock signals at normal operation. In this case, though not shown, the external power voltage VCC is directly outputted to the control circuits 5 as the internal power voltage VDDP.

FIG. 3 is a circuit diagram showing the configuration of the stepped-down power supply unit 8.

The first stepped-down power supply circuit 19 comprises transistors T1 through T3 and an amplifier AP1. The second stepped-down power supply circuit 20 comprises transistors T4 through T6 and amplifier AP2, and the third stepped-down power supply circuit 21 comprises transistors T7 through T12.

The transistors T1, T2, T4, T5, T7, T8 and T10 are P-channel MOS transistors, and the other transistors T3, T6, T9, T11 are T12 are N-channel MOS transistors.

The transistor T1 and the amplifier AP1 of the first stepped-down power supply circuit 19 are greater in current drive capacity than the transistor T5 and the amplifier AP2, respectively, provided in the second stepped-down power supply circuit 20.

One connecting part of each of the transistors T1, T2, T4, T5, T7, T8 and T10 is so connected as to be supplied with a power voltage VCC. The output part of the amplifier AP1, the gate of the transistor T2 and one connecting part of the transistor T3 are connected to the other connecting part of the transistor T1, while the gate of the transistor T1 is so connected that a control signal C4 outputted from the VDC control circuit 18 be inputted to it.

A reference potential (ground) VSS is connected to the other connecting part of the transistor T3. The gate of this transistor T3 is so connected that the control signal C4 outputted from the VDC control circuit 18 be inputted to it.

The amplifiers AP1 and AP2 are turned on when activating signals APE1 and APE2 are Hi signals, and one input part of each of them is so connected that the reference voltage Vref generated by the reference voltage unit be inputted to it. The amplifiers AP1 and AP2 compare the reference voltage Vref with the level of voltage resulting from division by the voltage dividing circuit 23, and output the result of comparison.

The output part of the amplifier AP2, the gate of the transistor T5 and one connecting part of the transistor T6 are connected to the other connecting part of the transistor T4. A reference potential VSS is connected to the other connecting part of the transistor T6. The gates of the transistors T4 and T6 are so connected that the control signals C6 and C7 outputted from the VDC control circuit 18 be inputted to them.

The gates of the transistors T7 through T10 are so connected that the control signals C1 through C3 outputted from the VDC control circuit 18 be inputted to them. One connecting part and the gate of the transistor (stepping-down MOS transistor, level shift unit) T9 are connected to the other connecting part of the transistor (second switching means, level shift unit) T8.

One connecting part and the gate of the transistor (stepping-down MOS transistor, level shift unit) T11 are connected to the other connecting part of the transistor (second switching means, level shift unit) T10, while one connecting part and the gate of the transistor (stepping-down MOS transistor, level shift unit) T12 are connected to the other connecting part of the transistor T11.

The voltage dividing circuit 23 has a configuration in which a plurality of transistors are connected between the internal power voltage VDDP and the reference potential VSS, and voltage division by resistance in each transistor causes a voltage to be generated. The voltages resulting from division by the voltage dividing circuit 23 are so connected as to be inputted to the other input parts of the amplifiers AP1 and AP2.

The other connecting parts of the transistors T2, T5, T7, T9 and T12 are connected to one another to constitute the output part for the internal power voltage VDDP in the stepped-down power supply unit 8.

FIG. 4 illustrates the external voltage detecting unit 2.

In FIG. 4, the left-hand part shows a block diagram of the external voltage detecting unit 2, and the right-hand part shows the signal states of the detection flags F1 through F3 outputted from the external voltage detecting unit 2 according to power voltage VCC.

The external voltage detecting unit 2 comprises a power voltage detecting circuit 2a and a latch 2b. The power voltage detecting circuit 2a, as shown on the right-hand side of FIG. 4, outputs the detection flags F1 through F3 according to the level of the power voltage VCC.

For instance, when the power voltage VCC is at a lower level than about 2.4 V (determination voltage level), the detection flag F1 will become a Lo signal, and the detection flags F2 and F3, Hi signals. When the power voltage VCC is at or higher than about 2.4 V, the detection flags F1 and F3 will become Hi signals and the detection flag F2, a Lo signal. If the power voltage VCC reaches or surpasses about 3.0 V, the detection flags F1 and F2 will become Hi signals and the detection flag F3, a Lo signal.

The latch 2b latches the detection flags F1 through F3 outputted from the power voltage detecting circuit 2a on the basis of a standby enable signal inputted from outside. When a standby enable signal in inputted, the power voltage detecting circuit 2a enters into a sleeping state.

Next will be described the actions of the stepped-down power supply unit 8 in this embodiment of the invention.

First, the actions of the stepped-down power supply unit 8 during normal operation of the flash memory 1 will be described.

When the flash memory 1 is in normal operation, a signal to notify the VDC control circuit 18 of the normal operating mode is outputted from the logical circuits 12. Therefore, the VDC control circuit 18 so performs control that the internal power voltage VDDP be outputted from the first stepped-down power supply circuit 19. In this case, the control signals C1 through C4 are supposed to be Hi signals, the control signals C5 through C7, Lo signals, the activating signal APE1, a Hi signal and the activating signal APE2, a Lo signal.

In the first stepped-down power supply circuit 19, as the transistors T1 and T3 are OFF, the internal power voltage VDDP is outputted via the transistor T2 according to the signal outputted from the amplifier AP1. The amplifier AP1 compares the reference voltage Vref outputted from the reference voltage unit 22 with the level of voltage resulting from division by the voltage dividing circuit 23, and outputs the result of comparison.

The second stepped-down power supply circuit 20 enters into a stopped state as the turning OFF of the amplifier AP2 and the turning ON of the transistor T4 turn the transistor T5 OFF. The third stepped-down power supply circuit 21 also enters into a stopped state as the transistors T7, T8 and T10 are turned OFF.

Next will be described the actions of the stepped-down power supply unit 8 when the flash memory 1 is in the low power consumption mode.

When the flash memory 1 is in the low power consumption mode, a signal notifying the VDC control circuit 18 of the low power consumption mode is already outputted from the logical circuits 12. Therefore, the VDC control circuit 18 so performs control that the internal power voltage VDDP be outputted from the second stepped-down power supply circuit 20. In this case, the control signals C1 through C3 and C6 are supposed to be Hi signals, the control signal C4, C5 and C7, Lo signals, the activating signal APE1, a Lo signal and the activating signal APE2, a Hi signal.

As a result, the first stepped-down power supply circuit 19 enters into a stopped state as the turning OFF of the amplifier AP1 and the turning ON of the transistor T1 turn the transistor T2 OFF in the first stepped-down power supply circuit 19. The third stepped-down power supply circuit 21 also enters into a stopped state as the transistors T7, T8 and T10 are turned OFF.

As the transistors T1 and T3 are turned OFF in the second stepped-down power supply circuit 20, an internal power voltage VDDP of about 1.6 V, a lower level than in the normal operating mode, is outputted via the transistor T5 according to a signal outputted from the amplifier AP2. The amplifier AP2 compares the reference voltage Vref outputted from the reference voltage unit 22 with the level of voltage resulting from division by the voltage dividing circuit 23, and outputs the result of comparison.

Since the amplifier AP2 and the transistor T5 here are smaller in current drive capacity than the amplifier AP1 and the transistor T2 as mentioned above, supply of the internal power voltage VDDP by the second stepped-down power supply circuit 20 can make its power consumption smaller than that of the first stepped-down power supply circuit 19.

Next will be described the actions the stepped-down power supply unit 8 when the flash memory 1 is in the standby mode.

FIG. 5 illustrates the states of the internal power voltage VDDP and the control signals C1 through C7 in the standby mode.

When the flash memory 1 is in the standby mode, a signal notifying the VDC control circuit 18 of the standby mode is already outputted from the logical circuits 12, and the VDC control circuit 18 so performs control that the internal power voltage VDDP be outputted from the third stepped-down power supply circuit 21.

Then, if a power voltage VCC of about 3.3 V, for instance, is supplied to the flash memory 1, the detection flags F1 and F2 of Hi signals and the detection flag F3 of a Lo signal will be outputted from the power voltage detecting circuit 2a as shown in FIG. 4.

When a standby enable signal is inputted, the power voltage detecting circuit 2a enters into a sleeping state, and the latch 2b will latch the signal states of the detection flags F1 through F3, which will be outputted to the VDC control circuit 18.

The VDC control circuit 18 judges from the states of the inputted detection flags F1 through F3 that the power voltage VCC is at or higher than about 3.0 V, and so outputs the control signals C1 through C7 so that the third stepped-down power supply circuit 21 generate the optimal internal power voltage VDDP.

In this case, since the power voltage VCC is at a high level of about 3.3 V, the VDC control circuit 18 so generates the control signals C1 through C7 that the third stepped-down power supply circuit 21 selects the path which would allow the voltage to be brought down most significantly.

Therefore, Hi control signals C1 and C2 and Lo control signals C3 through C7 are outputted from the VDC control circuit 18 as shown in FIG. 5.

Since, as a result, the transistor T1 is turned ON and the transistor T3 is turned OFF in the first stepped-down power supply circuit 19, a Hi signal is inputted to the gate of the transistor T2, and the transistor T2 is turned OFF.

As the transistor T4 is turned ON and the transistor T6 is turned OFF also in the second stepped-down power supply circuit 20, a Hi signal is inputted to the gate of the transistor T5, and the transistor T5 is turned OFF.

In the third stepped-down power supply circuit 21, though the transistors T7 and T8 are turned OFF, the transistor T10 is turned ON by a Lo control signal C3. Therefore, the internal power voltage VDDP is outputted via the transistors T11 and T12 as the power voltage VCC.

For instance, since the voltage drops at the time the transistors T11 and T12 are turned ON are about 0.6 V each, an internal power voltage VDDP of about 2.1 V is outputted.

When the power voltage VCC is about 3.0 V, as in the case where the power voltage VCC is about 3.3 V, the control signals C1 and C2 are Hi signals and the control signals C3 through C7 are Lo signals. Therefore, the internal power voltage VDDP outputted via the transistors T11 and T12 is about 1.8 V.

When the power voltage VCC is about 2.4 V, the control signals C1 and C3 are Hi signals and the control signals C2 and C4 through C7 are Lo signals as shown in FIG. 5. Therefore, the transistors T7 and T10 are turned OFF and only the transistor T8, to whose gate a Lo signal has been inputted, is turned ON in the third stepped-down power supply circuit 21.

When the transistor T8 is turned ON, as the power voltage VCC is outputted via the transistor T9 as the internal power voltage VDDP, an internal power voltage VDDP of about 1.8 V is generated and outputted.

Although the internal power voltage VDDP generated by the third stepped-down power supply circuit 21 thus is not very accurate, ranging from 1.8 V to 2.1 V, both approximately, it need not be so accurate when in the standby mode because it is sufficient to hold the voltages of internal nodes in the control circuits 5.

Further, when the power voltage VCC is about 1.8 V, the stepped-down power supply unit 8 directly outputs the power voltage VCC as the internal power voltage VDDP.

In this case, by having the control signal C1 Lo (turning ON the transistor T7) and the control signals C4 and C5 Hi (turning ON the transistor T2) or the control signals C6 and C7 Hi (turning ON the transistor T5) as shown in FIG. 5, the power voltage VCC can be directly outputted as the internal power voltage VDDP.

Since the internal power voltage VDDP is generated in the third stepped-down power supply circuit 21 through level shifting by the threshold voltage Vth of the transistors T9, T11 and T12, which are N-channel MOS transistors, adaptability to a wide range of power voltages VCC can thus be achieved without increasing power consumption.

This Embodiment 1 can thereby substantially reduce current consumption by the flash memory 1 when in the standby mode.

Further, since the internal power voltage VDDP is generated by the second stepped-down power supply circuit 20 whose current drive capacity is smaller than that of the first stepped-down power supply circuit in the low power consumption mode, power consumption by the flash memory 1 in the low power consumption mode can be correspondingly reduced.

Although the stepped-down power supply unit 8 (FIG. 3) is configured of three stepped-down power supply circuits including the first stepped-down power supply circuit 19, the second stepped-down power supply circuit 20 and the third stepped-down power supply circuit 21 in this Embodiment 1, the first stepped-down power supply circuit 19 and the second stepped-down power supply circuit 20 can as well be put together into a single circuit.

Figure 6:
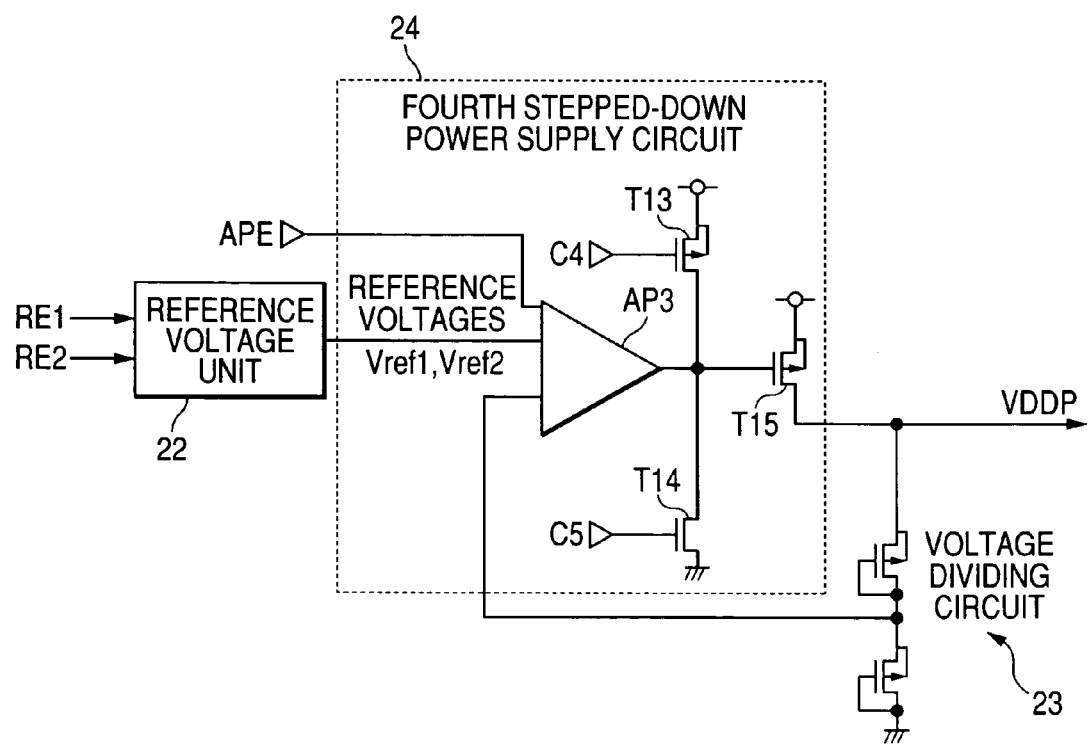
FIG. 6 is a circuit diagram of one example of stepped-down power supply unit provided in a flash memory, which is another embodiment of the invention.

FIG. 6 shows an example of configuration of a fourth stepped-down power supply circuit 24, which combines the first stepped-down power supply circuit 19 and the second stepped-down power supply circuit 20 into a single circuit.

The fourth stepped-down power supply circuit 24 comprises transistors T13 through T15 and an amplifier AP3. The transistors T13 and T15 are P-channel MOS transistors, while the transistor T14 is an N-channel MOS transistor.

One connecting part each of the transistors T13 and T15 is so connected as to be supplied with the power voltage VCC, while the output part of the amplifier AP3, one connecting part of the transistor T14 and the gate of the transistor T15 are connected to the other connecting part of the transistor T13. The reference potential VSS is connected to the other connecting part of the transistor T14.

The gate of the transistor T13 is so connected that the control signal C4 outputted from the VDC control circuit 18 (FIG. 1) be inputted to it, and the gate of the transistor T14 is so connected that the control signals C5 outputted from the VDC control circuit 18 (FIG. 1) be inputted to it.

One of the input parts of the amplifier AP3 is so connected that any one of the reference voltages Vref1 and Vref2 outputted from the reference voltage unit 22 is inputted, and the output part of the voltage dividing circuit 23 is connected to the other input part of the amplifier AP3. It is turned on when the activating signal APE is Hi.

The other connecting part of the transistor T15 constitutes the output part of the internal power voltage VDDP in the fourth stepped-down power supply circuit 24, and the voltage dividing circuit 23, connected between the internal power voltage VDDP and the reference potential VSS, outputs a voltage resulting from division of the internal power voltage VDDP.

The reference voltage unit 22 here has two control terminals, and these control terminals are connected to the VDC control circuit 18. The VDC control circuit 18 outputs any one of reference voltage enable signals RE1 and RE2 according to the operating mode of the flash memory 1 (the normal operating mode or the low power consumption mode).

The reference voltage unit 22 generates any one of the two reference voltages Vref1 and Vref2 on the basis of the reference voltage enable signal RE1 or RE2, and outputs it.

For instance, the VDC control circuit 18 outputs the reference voltage enable signal RE1, which is Hi, in the normal operating mode or the reference voltage enable signal RE2, which is Hi, in the low power consumption mode.

In this case, when the Hi reference voltage enable signal RE1 is outputted, the reference voltage unit 22 outputs the reference voltage Vref1, for instance. When the Hi reference voltage enable signal RE2 is outputted, the reference voltage unit 22 outputs the reference voltage Vref 2, which is lower in level than the reference voltage Vref1.

Then, the fourth stepped-down power supply circuit 24 generates the internal power voltage VDDP matching the level of one or the other of these reference voltages Vref1 and Vref2.

As the circuit configuration of the fourth stepped-down power supply circuit 24 can be significantly simplified thereby, the layout area of the flash memory 1 can be substantially reduced.

Figure 7:
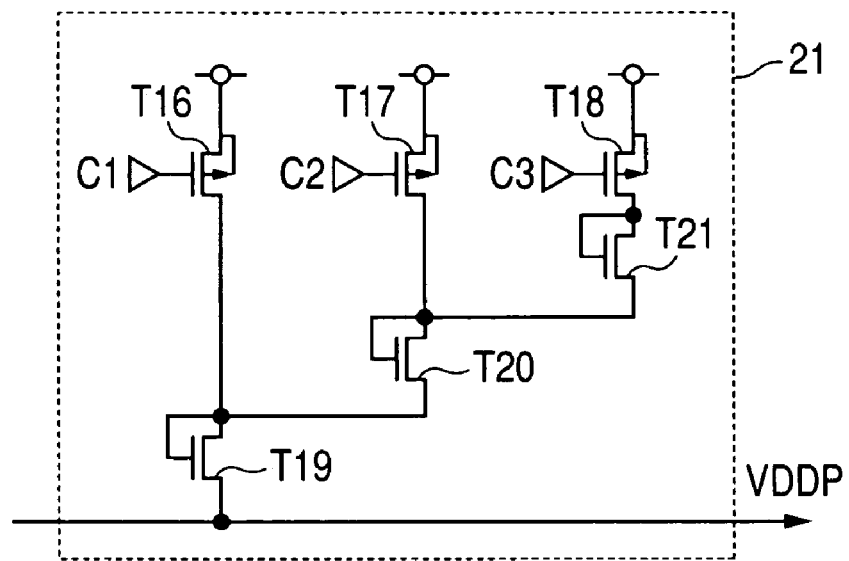
FIG. 7 is a circuit diagram of one example of third stepped-down power supply circuit provided in the flash memory, which is still another embodiment of the invention.

Furthermore, the third stepped-down power supply circuit 21 in this Embodiment 1 can be reduced in the number of transistors by, for instance, using the configuration shown in FIG. 7.

In this case, the third stepped-down power supply circuit 21 shown in FIG. 7 is comprised of transistors T16 through T21. The transistors T16 through T18 are P-channel MOS transistors, while the transistors T19 through T21 are N-channel MOS transistors.

The power voltage VCC is connected to one connecting part each of the transistors T16 through T18. One connecting part and the gate of the transistor T19 and the other connecting part of the transistor T20 are connected to the other connecting part of the transistor T16.

One connecting part and the gate of the transistor T20 and the other connecting part of the transistor T21 are connected to the other connecting part of the transistor T17. One connecting part and the gate of the transistor T21 are connected to the other connecting part of the transistor T18.

The gates of the transistors T16 through T18 are so connected that the control signals C1 through C3 outputted from the VDC control circuit 18 be inputted respectively. The other connecting part of the transistor T19 constitutes the output part for the internal power voltage VDDP in the third stepped-down power supply circuit 21.

Referring to FIG. 7, when the transistor T16, for instance, is turned ON with the control signal C1, the internal power voltage VDDP is outputted via the transistor 19, and by turning ON the transistor T17 with the control signal C2, the internal power voltage VDDP is caused to be outputted via the transistors T20 and T19. When the transistor T18 is turned ON with the control signal C3, the internal power voltage VDDP is outputted via the transistors T21, T20 and T19.

By selecting the path of the transistors T21, T20 and T19 where the voltage is stepped down with the control signals C1 through C3 in this way, the stepped-down level of the internal power voltage VDDP can be changed over as desired.

This enables the number of stepping-down N-channel MOS transistors, and accordingly the layout area of the flash memory 1, to be reduced.

Figure 8:
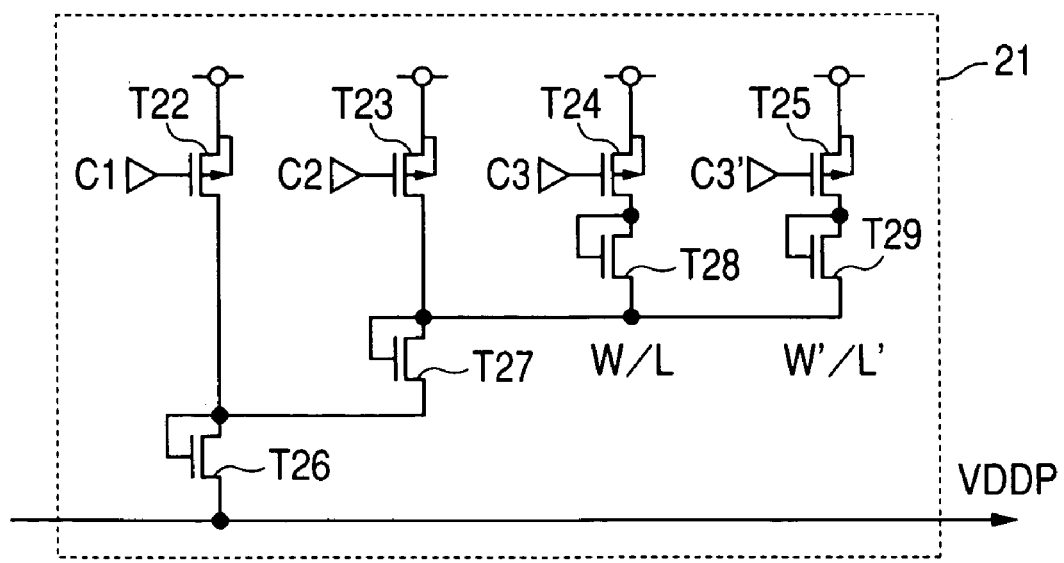
FIG. 8 is a circuit diagram of another example of third stepped-down power supply circuit provided in the flash memory, which is yet another embodiment of the invention.

Also, by using a configuration shown in FIG. 8, for instance, for the third stepped-down power supply circuit 21 in this Embodiment 1, fluctuations of the threshold voltage Vth of the stepping-down MOS transistor can be narrowed.

In this case, the third stepped-down power supply circuit 21 is configured of the transistors T22 through T29 as shown in FIG. 8. The transistors T22 through T25 are P-channel MOS transistors, while the transistors T26 through T29 are N-channel MOS transistors. The transistors T28 and T29 differ in, for instance, gate size.

One connecting part each of the transistors T22 through 25 is so connected as to be supplied with the power voltage VCC. One connecting part and the gate of the transistor T26 and the other connecting part of the transistor T27 are connected to the other connecting part of the transistor T22.

One connecting part and the gate of the transistor T27 and the other connecting part of the transistor T28 are connected to the other connecting part of the transistor T23. One connecting part and the gate of the transistor T28 and the other connecting part of the transistor T29 are connected to the other connecting part of the transistor T24. One connecting part and the gate of the transistor T29 are connected to the other connecting part of the transistor T25.

The gates of the transistors T22 through T25 are so connected that the control signals C1 through C3 and C3' outputted from the VDC control circuit 18 (FIG. 1) be inputted respectively. The other connecting part of the transistor T26 constitutes the output part for the internal power voltage VDDP in the third stepped-down power supply circuit 21.

Though the actions responding to the control signals C1 through C3 shown in FIG. 8 are similar to those described with reference to FIG. 7, the fluctuation of the threshold voltage VthH of transistors can be trimmed by selecting as desired either the transistor T24 or the transistor T25 differing in gate size with the newly added control signal C3', making possible generation of a more accurate internal power voltage VDDP.

(Embodiment 2)

Figure 9:
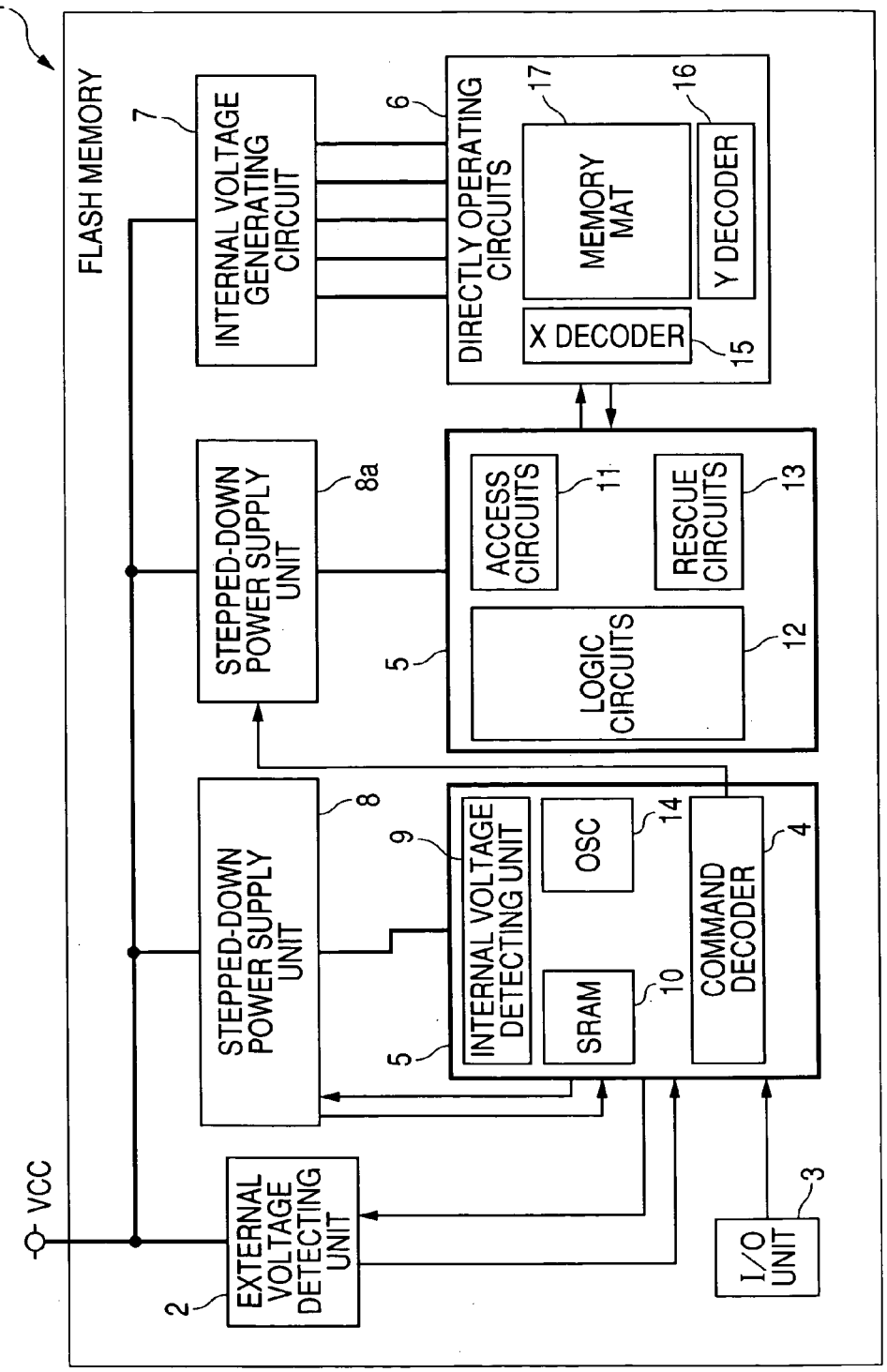
FIG. 9 is a block diagram of a flash memory, which is Embodiment 2 of the invention.

FIG. 9 is a block diagram of a flash memory, which is Embodiment 2 of the present invention.

In this Embodiment 2, the flash memory 1 has a configuration, as shown in FIG. 9, in which the above-described configuration of Embodiment 1 comprising the external voltage detecting unit 2, I/O unit 3, command decoder 4, control circuits 5, directly operating circuits 6, internal voltage generating circuit 7 and stepped-down power supply unit 8 is augmented with a stepped-down power supply unit 8a.

The internal voltage detecting unit 9, SRAM 10 and command decoder 4 in the control circuits 5 are so connected that the internal power voltage VDDP outputted from the stepped-down power supply unit 8 be supplied to each. The access circuits 11, logical circuits 12 and rescue circuits 13 in the control circuits 5 are so connected that the internal power voltage VDDP outputted from the stepped-down power supply unit 8a be supplied to each.

Regarding the stepped-down power supply units 8 and 8a, the stepped-down power supply unit 8 comprises the VDC control circuit 18, first stepped-down power supply circuit 19, second stepped-down power supply circuit 20, third stepped-down power supply circuit 21, reference voltage unit 22 and voltage dividing circuit 23 as in Embodiment 1 described above (FIG. 1).

The VDC control circuit 18 in each of the stepped-down power supply units 8 and 8a is so connected that a signal notifying any of the operating modes of the flash memory 1 (the normal mode, low power consumption mode, standby mode and deep standby mode) be inputted via the command decoder 4.

The flash memory of this Embodiment 2 has four operating modes including the normal mode, low power consumption mode, standby mode and deep standby mode. In the deep standby mode, power consumption is reduced even further than in the standby mode by stopping the supply of the internal power voltage VDDP by the stepped-down power supply unit 8a.

Next will be described the actions of the stepped-down power supply units 8 and 8a in this Embodiment 2.

First, when the flash memory 1 is in normal operation, a signal notifying the normal operating mode is outputted from the command decoder 4 to the VDC control circuit 18 of each of the stepped-down power supply units 8 and 8a. On the basis of this signal, the VDC control circuit 18 of each of the stepped-down power supply units 8 and 8*a* so performs control as to cause an internal power voltage VDDP to be outputted from the first stepped-down power supply circuit 19.

When the flash memory 1 is in the low power consumption mode, the VDC control circuit 18 of each of the stepped-down power supply units 8 and 8*a* so performs control, on the basis of a signal notifying the low power consumption mode outputted from the command decoder 4, as to cause an internal power voltage VDDP to be outputted from the second stepped-down power supply circuit 20 of each of the stepped-down power supply units 8 and 8*a*.

When the flash memory 1 is in the standby mode, in response to a signal notifying the standby mode outputted from the command decoder 4, the VDC control circuit 18 so performs control as to cause an internal power voltage VDDP to be outputted from the third stepped-down power supply circuit 21 of each of the stepped-down power supply units 8 and 8*a*.

Next, when the flash memory 1 is in the deep standby mode, upon receiving a signal notifying the deep standby mode outputted from the command decoder 4, the VDC control circuit 18 of the stepped-down power supply unit 8 so performs control as to cause an internal power voltage VDDP to be outputted from the third stepped-down power supply circuit 21 of the stepped-down power supply unit 8.

On the other hand, the VDC control circuit 18 provided in the stepped-down power supply unit 8*a* so performs control as to stop all of the first stepped-down power supply circuit 19, the second stepped-down power supply circuit 20 and the third stepped-down power supply circuit 21 provided in the stepped-down power supply unit 8*a*.

Therefore, it is possible to supply the internal power voltage VDDP only to, for instance, internal circuits which need to hold the voltages of internal nodes, such as the latch (the internal voltage detecting unit 9, the SRAM 10 and the command decoder 4) and stop supplying the internal power voltage VDDP to internal circuits which need not hold active voltages (the access circuits 11, the logical circuits 12 and the rescue circuits 13).

This enables, in the deep standby mode, off-leaks of the MOS transistors and the like of the access circuits 11, the logical circuits 12 and the rescue circuits 13 to be reduced.

For this reason, this Embodiment 2 can achieve a further saving in power consumption in the deep standby mode of the flash memory 1.

Although the invention made by the present inventors has been hitherto described in specific terms with reference to some of the preferred embodiments thereof, the invention is not confined to these embodiments, but various modifications are obviously possible without deviating from its true spirit and scope.

The invention is suitable for application to techniques to achieve a substantial saving in current consumption by a nonvolatile semiconductor memory operable on two or more different power voltages when it is in the standby mode.

What is claimed is:

1. A nonvolatile memory apparatus comprising:
   a memory array having a plurality of nonvolatile memory cells;
   a stepped-up/down power supply circuit for generating a first voltage for supplying to a nonvolatile memory cell from an external power voltage; and
   a stepped-down power supply unit for generating a second voltage for supplying to an internal circuit from the external power voltage,
   wherein in an operating mode, said stepped-down power supply unit generates the second voltage by stepped down from the external power voltage and supplies the second voltage to said internal logical circuits, and
   wherein in a standby mode, said stepped-down power supply unit determines the level of the external power voltage, and when the external power voltage is lower than a determination voltage level, supplies the external power voltage as the second voltage to said internal logical circuits, and when the external power voltage is higher than the determination voltage level, supplies a level shifted voltage, which is level shifted by the threshold voltage of a first MOS transistor, from the external power voltage as the second voltage to said internal logical circuits.

2. The nonvolatile memory apparatus according to claim 1,
   wherein said stepped-down power supply unit comprises:
   a voltage determining unit which determines the level of the external power voltage and outputs a control signal on the basis of the result of that determination;
   an operating mode power voltage circuit which, on the basis of the control signal from said voltage determining unit, generates a stepped-down power voltage from the external power voltage in the operating mode and supplies it to said internal logical circuits; and
   a standby mode stepped-down power supply circuit which, on the basis of the control signal from said voltage determining unit, when in the standby mode the external power voltage is lower than the determination voltage level, supplies said internal logical circuits with that external power voltage as the stepped-down power voltage, and when the external power voltage is higher than the determination voltage level, supplies said internal logical circuits with the stepped-down power voltage resulting from the level-shifting of the external power voltage with the threshold voltage of the stepping-down MOS transistors.

3. The nonvolatile memory apparatus according to claim 2,
   wherein said standby mode stepped-down power supply circuit comprises:
   first switching means which outputs an external power voltage on the basis of a control signal; and
   a level shift unit comprising second switching means which outputs an external power voltage on the basis of a control signal and said stepping-down MOS transistors which are connected to said second switching means and level-shift an external power voltage outputted via said second switching means, and
   wherein said voltage determining unit, in the standby mode, so outputs a control signal as to actuate said first switching means when the external power voltage is lower than the determination voltage level, or so outputs a control signal as to actuate said second switching means when the external power voltage is higher than the determination voltage level.

4. The nonvolatile memory apparatus according to claim 3,
   wherein said level shift unit, when the external power voltage is higher than said determination voltage level, makes variable the extent of level shift by said stepping-down MOS transistor according to the level of the external power voltage.

5. The nonvolatile memory apparatus according to claim 4, wherein the extent of level shift by said stepping-down MOS transistors is enabled to vary by making the number of connection stages of said stepping-down MOS transistors variable.

6. The nonvolatile memory apparatus according to claim 5, wherein said operating mode power voltage circuit comprises:

a mode detecting unit which detects whether the operating mode is said normal operating mode or a low power consumption mode and outputs a control signal on the basis of the result of the detection;

a first operating mode power voltage circuit which, on the basis of the control signal outputted from said mode detecting unit, generates a stepped-down power voltage from the external power voltage and supplies it to said internal logical circuits; and a second operating mode power voltage circuit whose current drive capacity is set smaller than that of said first operating mode power voltage circuit; and wherein said mode detecting unit, actuates, when it detects the normal operating mode, said first operating mode power voltage circuit to output a control signal so as to stop said second operating mode power voltage circuit, and actuates, when it detects the low power consumption mode, said second operating mode power voltage circuit to output a control signal so as to stop said first operating mode power voltage circuit.

7. The nonvolatile memory apparatus according to claim 6, wherein said first operating mode power voltage circuit, when in the normal mode said voltage determining unit determines the level of the external power voltage to be lower than the determination voltage level, supplies said internal logical circuits with that external power voltage as the stepped-down power voltage.

* * * * *